United States Patent [19]
Liang et al.

[11] Patent Number: 5,962,919
[45] Date of Patent: Oct. 5, 1999

[54] BONDING PAD STRUCTURE FOR INTEGRATED CIRCUIT (III)

[75] Inventors: Wen-Hao Liang, Hsinchu; Chin-Jong Chan, Hsinchu Hsien; Hsiu-Hsin Chung, Kaohsiung; Rueyway Lin, Hsinchu, all of Taiwan

[73] Assignee: Winbond Electronics Corp., Hsinchu, Taiwan

[*] Notice: This patent issued on a continued prosecution application filed under 37 CFR 1.53(d), and is subject to the twenty year patent term provisions of 35 U.S.C. 154(a)(2).

[21] Appl. No.: 09/042,236

[22] Filed: Mar. 13, 1998

[30] Foreign Application Priority Data

Sep. 15, 1997 [TW] Taiwan ................................. 86113411

[51] Int. Cl.⁶ .................................................. H01L 23/48
[52] U.S. Cl. ......................... 257/748; 257/758; 257/781; 257/773; 438/612; 438/614
[58] Field of Search ..................................... 257/377, 380, 257/382, 773, 626, 632, 639, 649, 690, 700, 734, 750, 752, 754, 758, 764, 784, 786, 781, 774, 748; 438/106, 612, 614, 652, 666

[56] References Cited

U.S. PATENT DOCUMENTS

| | | | |
|---|---|---|---|
| 4,060,828 | 11/1977 | Satonaka | 257/748 |
| 5,248,903 | 9/1993 | Heim | 257/748 |
| 5,372,969 | 12/1994 | Moslehi | 438/106 |
| 5,463,245 | 10/1995 | Hiruta | 257/626 |
| 5,707,894 | 1/1998 | Hsiao | 438/614 |
| 5,736,791 | 4/1998 | Fujiki et al. | 257/781 |

*Primary Examiner*—Tom Thomas
*Assistant Examiner*—Luan Thai
*Attorney, Agent, or Firm*—Fish & Richardson P.C.

[57] ABSTRACT

A bonding pad structure in accordance with the present invention is formed on a semiconductor substrate. The bonding pad structure comprises a buffer layer, a planarization layer, a conducting pad, and a passivation layer. The buffer layer is formed over the semiconductor substrate, and the planarization layer is thereafter formed on the buffer layer. The buffer layer is patterned and etched to shape a plurality of contact holes. The conducting pad is formed on the planarization layer and filled in the contact holes in order to mechanically interlock with the planarization layer. The passivation layer overlies peripherals of the conducting pad forming an overhang region therebetween. Moreover, the width of a portion of the overhang region close to a drawing direction may be enlarged so that the adhesion between the conducting pad and the passivation layer can be increased.

16 Claims, 5 Drawing Sheets

BONDING PAD STRUCTURE FOR INTEGRATED CIRCUIT (III)

BACKGROUND OF THE INVENTION

1. Field of the Invention

The present invention generally relates to semiconductor integrated circuit fabrication. In particular, the present invention relates to a bonding pad structure for an integrated circuit, which can enhance peeling resistance ability via a form of mechanical interlocking.

2. Description of the Prior Art

Wedge bonding technologies play a critical role in the fabrication of chip-on-board (COB) circuitry, and have been widely applied to commercial electronic products. With the ongoing progress made by the semiconductor IC fabrication community in the miniaturization of the size of device feature, bonding pads provided for external connections, for example, have been gradually decreased from a layout area of greater than 100 $\mu$m×100 $\mu$m used previously.

Referring to FIG. 1, a conventional bonding pad for an integrated circuit after bonding is schematically illustrated in a top view. Moreover, FIG. 2 is a cross-sectional view of FIG. 1. The bonding pad shown in FIGS. 1 and 2 is formed on a semiconductor substrate 10, in which a number of electronic devices (not shown in the drawing) have been fabricated. For isolation between a subsequently-formed conducting pad 12 and the devices fabricated in the semiconductor substrate 10, an insulating layer 11 is formed to overlie the semiconductor substrate 10. The conducting pad 12 is thereafter deposited on the insulating layer 11. The insulating layer 11 is further in charge of planarization, the thickness of which should be sufficient and which is usually made of borophosphosilicate glass (BPSG). The conducting pad 12 is preferably a metal layer made of multi-layer material of TiN/Al—Si—Cu/TiN/Ti, which serves the function of transmitting an input signal or an output signal, or tying to a power level or a ground level, etc. Reference numeral 13 designates a passivation layer overlying the semiconductor substrate 10 to prevent scratches or cracking in the internal circuitry. The passivation layer 13 is partially etched away to expose a portion of the conducting pad 12 for wedge bonding. Accordingly, the overhang region between the conducting pad 12 and the passivation layer 13 is referred to numeral 14 in the drawing.

Usually, while the bonding procedure is being performed, one end of a conducting line 15 made, for example, of aluminum filaments, is first bonded to the exposed portion of the conducting pad 12 by a wedge bonder. However, another end is drawn in a direction 18 as shown in FIG. 1 and tied to one bond finger of a lead frame (not shown in the drawing) so as to electrically connect the bonding pad to the associated bond finger.

Nonetheless, although the semiconductor industry has made the progress in miniaturization, the wedge bonder used for the chip-on-board fabrication is still restricted in its precision. Therefore, misalignment may occur during bonding and cause damage to the passivation layer 13. Even worse, the force used to draw the conducting line 15 along the direction 18 may give rise to peeling and worsens the yield loss.

However, another bonding pad structure has been proposed whereby the width of the overhang region 14 is increased so as to enhance the adhesion between the conducting pad 12 and the passivation layer 13, but which involves a tradeoff and the drawback of large layout area.

For the foregoing reason, there is a need for a novel bonding pad structure that can withstand peeling while the bonding procedure being performed, while at the same time consumeing less layout area.

SUMMARY OF THE INVENTION

Therefore, an object of the present invention is to provide a bonding pad structure that can resist against peeling via a form of mechanical interlocking.

Another object of the present invention is to provide a bonding pad structure that expends less layout area.

The present invention achieves the above-indicated objects by providing a bonding pad structure formed on a semiconductor substrate. The bonding pad structure comprises a buffer layer, a planarization layer, a conducting pad, and a passivation layer. The buffer layer is formed over the semiconductor substrate, and the planarization layer is thereafter formed on the buffer layer. The planarization layer is patterned and etched to shape a plurality of contact holes. The conducting pad is formed on the planarization layer and filled in the contact holes in order to mechanically interlock with the planarization layer. The passivation layer overlies the peripherals of the conducting pad forming an overhang region therebetween.

BRIEF DESCRIPTION OF THE DRAWINGS

The following detailed description, given by way of example and not intended to limit the invention solely to the embodiments described herein, will best be understood in conjunction with the accompanying drawings, in which.

DETAILED DESCRIPTION OF THE PREFERRED EMBODIMENTS

First Embodiment

Figure 1:
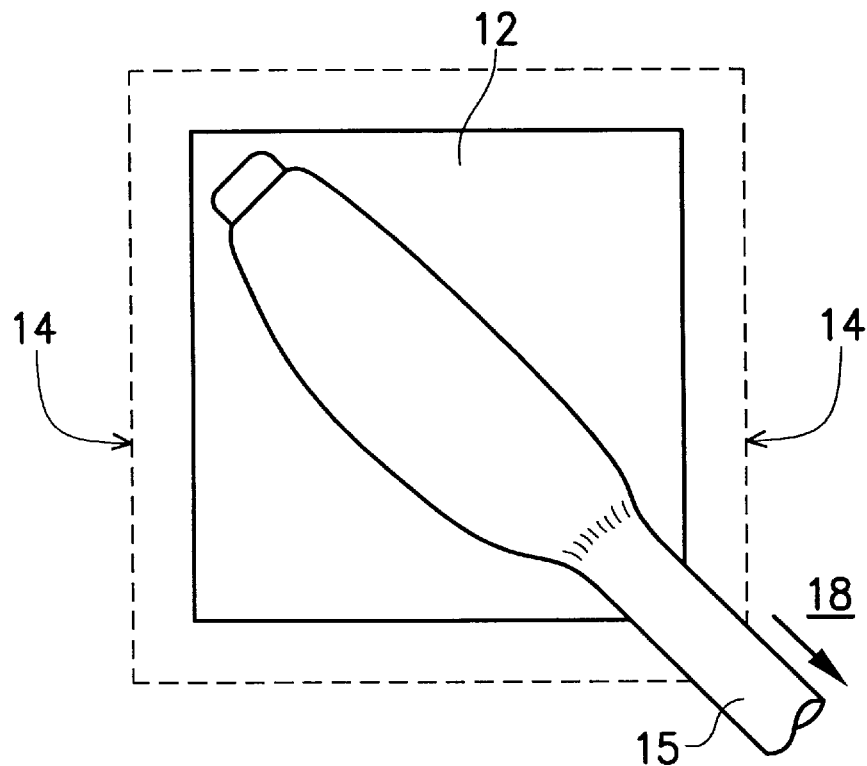
FIG. 1 schematically depicts a conventional bonding pad for an integrated circuit after bonding in a top view.
Figure 2:
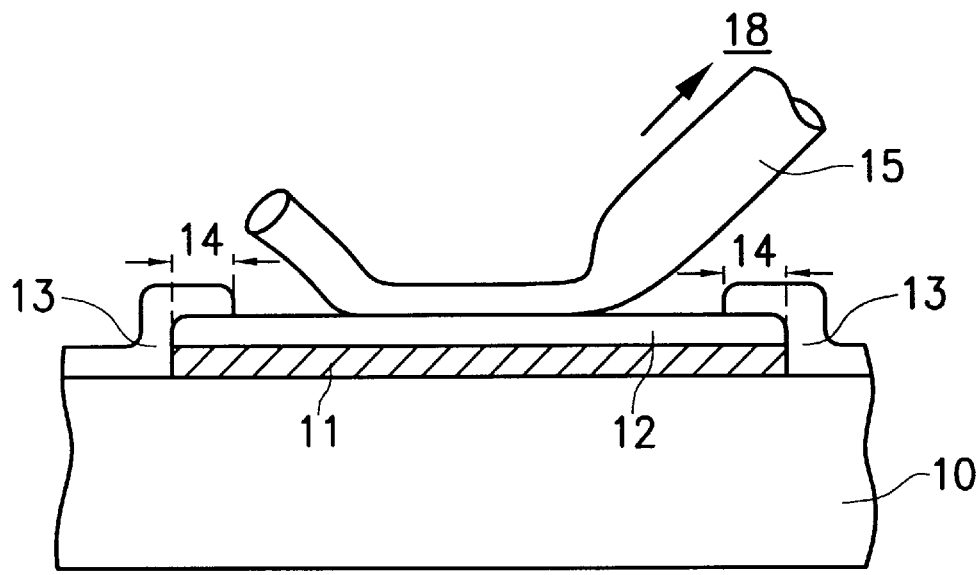
FIG. 2 schematically depicts a cross-sectional view of FIG. 1.
Figure 3:
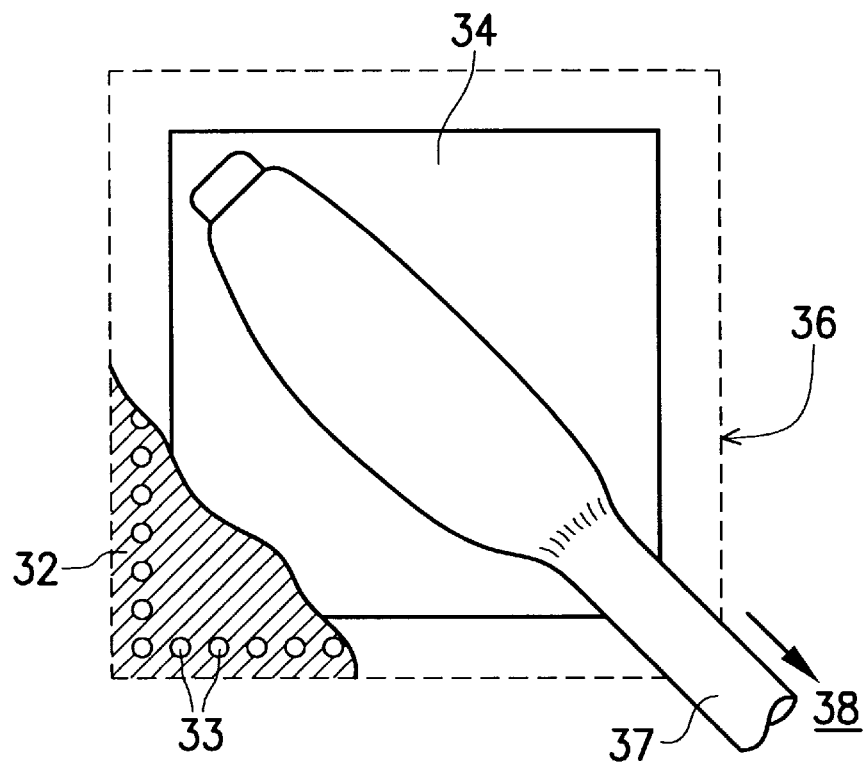
FIG. 3 schematically depicts the first preferred embodiment in accordance with the present invention after bonding in a top view.
Figure 4:
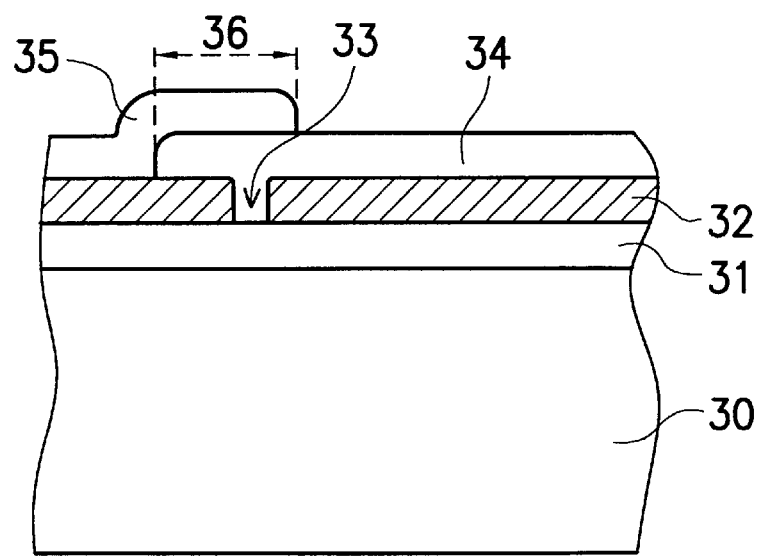
FIG. 4 schematically depicts the partially enlarged cross-sectional view of FIG. 3.

Referring to FIG. 3, the first preferred embodiment in accordance with the present invention after bonding is schematically depicted in a top view. Moreover, FIG. 4 is the partially enlarged cross-sectional view of FIG. 3. The bonding pad shown in FIGS. 3 and 4 is formed over a semiconductor substrate 30, in which a number of devices (not shown in the drawing) have been fabricated.

First of all, a buffer layer 31 is formed on the semiconductor substrate 30. Preferably, the buffer layer may be an undoped polysilicon layer deposited in a low-pressure chemical vapor deposition (LPCVD) reactor. An planarization layer 32, preferably made of borophosphosilicate glass (BPSG), is thereafter formed on the buffer layer 31, the thickness of which should be sufficient to planarize the overall surface. Then, by means of photolithography, the planarization layer 32 is patterned and etched to form a plurality of contact holes 33 positioned within the range of an overhang region 36 (which will be described in the following).

Next, the conducting pad 34 is deposited on the planarization layer 32 and further filled into all of the contact holes 33. The conducting pad 34 is preferably a metal layer made of multi-layer material of TiN/Al—Si—Cu/TiN/Ti, which serves the function of transmitting an input signal or an output signal, or tying to a power level or a ground level, etc. Reference numeral 35 designates a passivation layer, preferably made of silicon-oxynitride, overlying the semiconductor substrate 30 to prevent scratches or cracking in the internal circuitry. The passivation layer 35 is partially etched away to expose a portion of the conducting pad 34 for wedge bonding. Accordingly, the overhang region between the conducting pad 34 and the passivation layer 35 is referred to numeral 36 in the drawing.

Usually, during bonding, one end of a conducting line 37 made, for example, of aluminum filaments, is bonded to the exposed portion of the conducting pad 34 by a wedge bonder. However, another end is drawn in a direction 38 as shown in FIG. 3 and tied to one bond finger of a lead frame (not shown in the drawing) so as to electrically connect the bonding pad to the associated bond finger.

In the first preferred embodiment, the underlying planarization layer 32 is patterned to form the contact holes 33 merely positioned within the range of the overhang 36, and the conducting pad 34 is made to fill in those contact holes 33. Even if misalignment occurs, while the conducting line 37 is being bonded, peeling resistance ability can be increased via a form of mechanical interlocking. Preferably, those contact holes 33 have a diameter of from about 0.5 $\mu$m to several micrometers, whereas the spacing among the contact holes is greater than 0.5 $\mu$m. Although circles as shown in FIG. 3 exemplify the contact holes, other shapes such as rectangular, square, triangular, ellipse, polygon, etc., can also be utilized to achieve the objects of the present invention.

Second Embodiment

Figure 5:
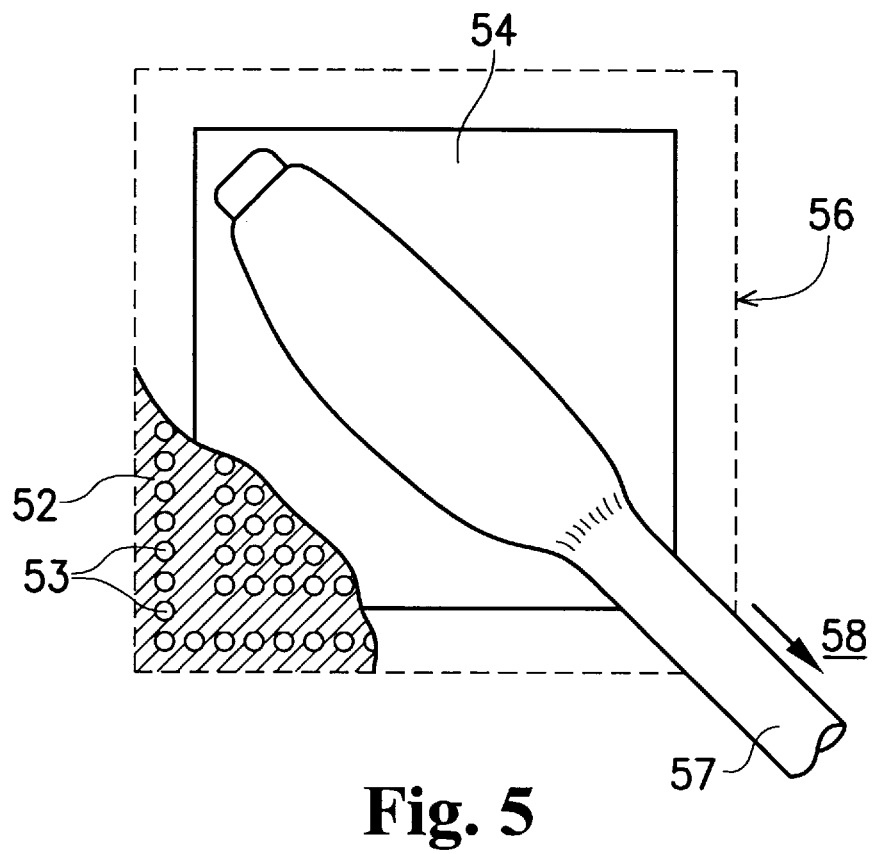
FIG. 5 schematically depicts the second preferred embodiment in accordance with the present invention after bonding in a top view.
Figure 6:
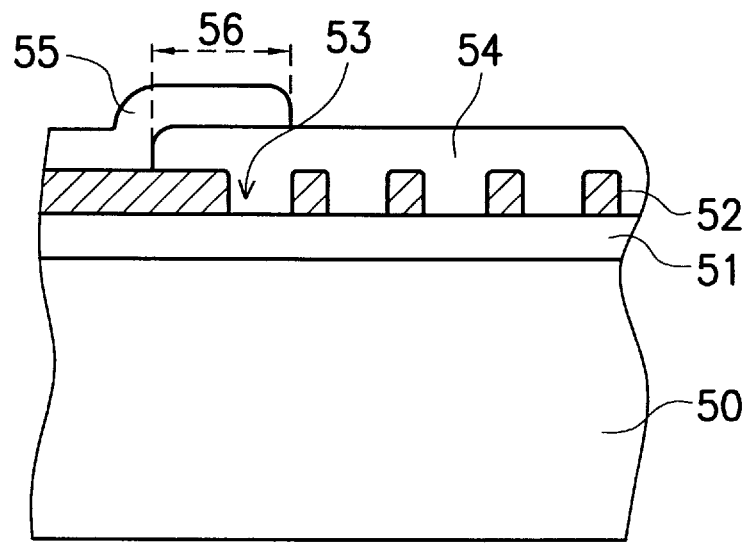
FIG. 6 schematically depicts the partially enlarged cross-sectional view of FIG. 5.

Referring to FIG. 5, the second preferred embodiment in accordance with the present invention after bonding is schematically depicted in a top view. Moreover, FIG. 6 is the partially enlarged cross-sectional view of FIG. 5. The bonding pad shown in FIGS. 5 and 6 is formed over a semiconductor substrate 50, in which a number of devices (not shown in the drawing) have been fabricated. First of all, a buffer layer 51 is formed to cover the surface of the semiconductor substrate 50. Preferably, the buffer layer may be an undoped polysilicon layer deposited in a low-pressure chemical vapor deposition (LPCVD) reactor. An planarization layer 52, preferably made of borophosphosilicate glass (BPSG), is thereafter formed on the buffer layer 51, thickness of which should be sufficient to planarize the overall surface. By means of photolithography, the planarization layer 52 is patterned and etched to form a plurality of contact holes 53 positioned underneath the overall range of a conducting pad 54 (which will be described in the following).

Next, the conducting pad 54 is thereafter deposited on the planarization layer 52 and further filled into the contact holes 53. The conducting pad 54 is preferably a metal layer made of multi-layer material of TiN/Al—Si—Cu/TiN/Ti, which serves the function of transmitting an input signal or an output signal, or tying to a power level or a ground level, etc. Reference numeral 55 designates a passivation layer, preferably made of silicon-oxynitride, overlying the semiconductor substrate 50 to prevent scratches or cracking in the internal circuitry. The passivation layer 55 is partially etched away to expose a portion of the conducting pad 54 for wedge bonding. Accordingly, the overhang region between the conducting pad 54 and the passivation layer 55 is referred to numeral 56 in the drawing.

Usually, during bonding, one end of a conducting line 57 made, for example, of aluminum filaments, is bonded to the exposed portion of the conducting pad 54 by means of a wedge bonder. However, another end is drawn in a direction 58 as shown in FIG. 5 and tied to one bond finger of a lead frame (not shown in the drawing) so as to electrically connect the bonding pad to the associated bond finger.

In the second preferred embodiment, the underlying planarization layer 52 is patterned to form the contact holes 53 positioned underneath the overall range of the conducting pad 54, and, in addition, the conducting pad 54 is made to fill in all contact holes 53. Even if misalignment occurs, while the conducting line 57 is bonded, peeling resistance ability can be increased in via a form of mechanical interlocking. Those contact holes 53 have a diameter of from about 0.5 $\mu$m to several micrometers, whereas the spacing among the contact holes 53 is greater than 0.5 $\mu$m. Although circles as shown in FIG. 5 exemplify the contact holes, other shapes such as rectangular, square, triangular, ellipse, polygon, etc can also be utilized to achieve the objects of the present invention.

Third, Fourth, and Fifth Embodiments

Figure 7:
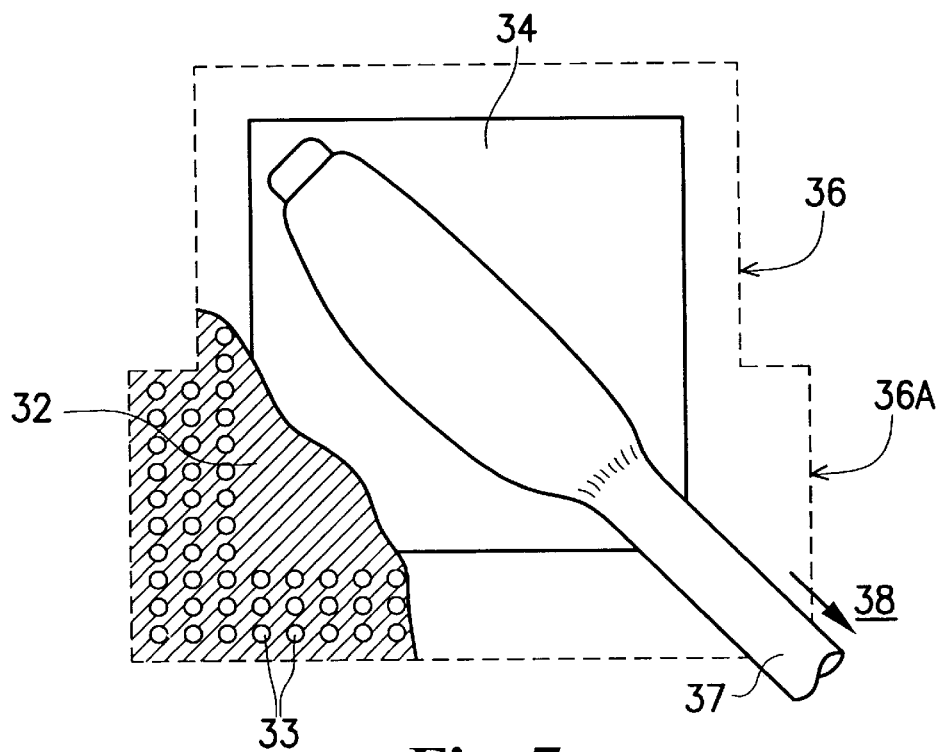
FIG. 7 schematically depicts the third preferred embodiment in accordance with the present invention after bonding in a top view.
Figure 8:
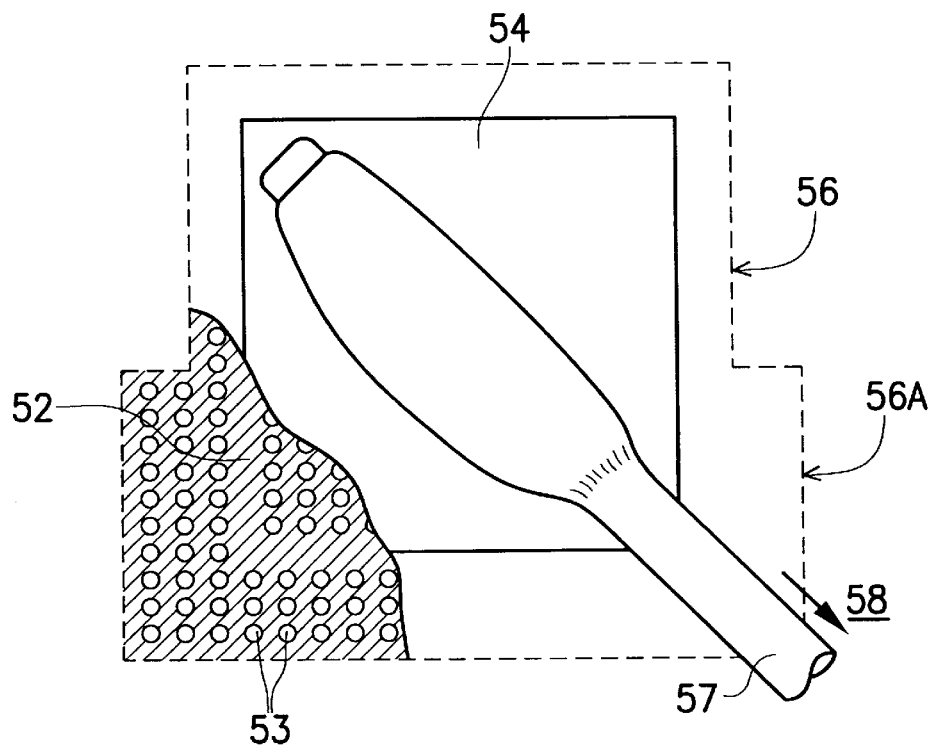
FIG. 8 schematically depicts the fourth preferred embodiment in accordance with the present invention after bonding in a top view.

FIGS. 7 and 8 schematically depict the third and fourth preferred embodiments in accordance with the present invention after bonding in a top view. FIGS. 7 and 8 are different from respective FIGS. 3 and 4 respectively in that: the width of the overhang regions 36 and 56 close to the respective drawing directions 38 and 58 is increased to be wider overhang regions 36A and 56A, respectively. Such a width-enlarged structure therefore enhances the adhesion between the conducting pad and the passivation layer.

Figure 9:
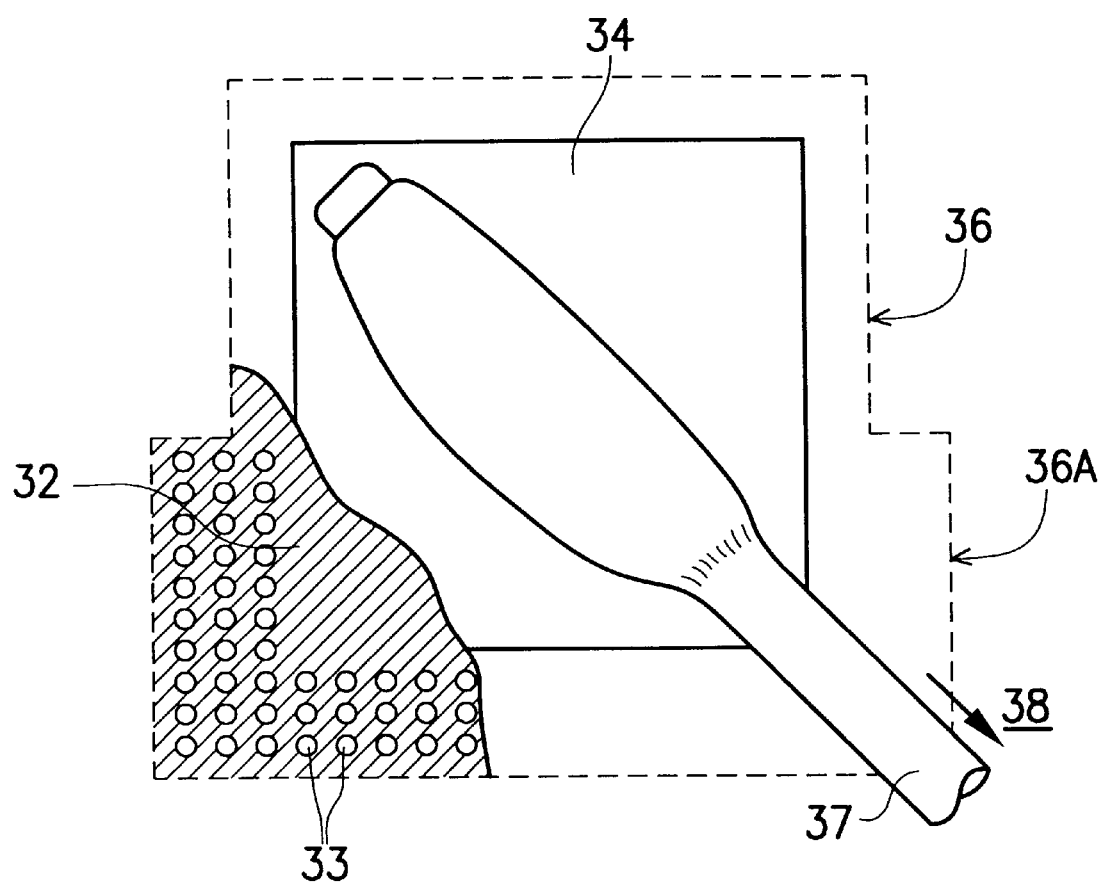
FIG. 9 schematically depicts the fifth preferred embodiment in accordance with the present invention after bonding in a top view.

FIG. 9 schematically depicts the fifth preferred embodiment in accordance with the present invention after bonding in a top view. As compared with FIG. 7, the fifth preferred embodiment illustrated in FIG. 9 positions the contact holes 33 within the range of the wider overhang region 36A close to the drawing direction 38, which can also be utilized to achieve the objects of the present invention.

In conclusion, the present invention discloses several preferred embodiments suited to input pads, output pads, I/O pads, power pads, and ground pads. At least a portion of the planarization layer is patterned to shape the contact holes just beneath the overhang region between the conducting pad and the passivation layer. By means of mechanical interlocking, the conducting pad is filled into the contact holes so as to enhance peeling resistance ability of the bonding pad. Moreover, the width of a portion of the overhang region close to the drawing direction may be enlarged so that the adhesion between the conducting pad and the passivation layer can be increased.

The foregoing description of preferred embodiments of the present invention has been provided for the purposes of illustration and description. It is not intended to be exhaustive or to limit the invention to the precise forms disclosed. Many modifications and variations will be apparent to practitioners skilled in the art. The embodiments were chosen and described to best explain the principles of the invention and its practical application, thereby enabling others skilled in the art to understand the invention, to practice various other embodiments, and to make various modifications suited to the particular use contemplated. It is intended that the scope of the invention be defined by the following claims and their equivalents.

What is claimed is:

1. A bonding pad structure formed on a semiconductor substrate, comprising:

an undoped polysilicon layer formed over said semiconductor substrate;

a planarization layer formed on said undoped polysilicon layer and patterned to shape a plurality of contact holes;

a metal pad formed on said planarization layer and filling in said contact holes to directly contact with said undoped polysilicon layer so as to mechanically interlock with said planarization layer; and a passivation layer overlying peripherals of said conducting pad to form an overhang region therebetween, wherein at least a portion of said contact holes are positioned within the range of said overhang region.

2. The bonding pad structure as claimed in claim 1, wherein said contact holes are positioned within the range of said overhang region.

3. The bonding pad structure as claimed in claim 1, wherein a second portion of said contact holes are positioned underneath a portion of said conducting pad located outside said overhand region.

4. The bonding pad structure as claimed in claim 1, wherein said buffer layer is an polysilicon layer.

5. The bonding pad structure as claimed in claim 1, wherein said planarization layer is a borophosphosilicate glass (BPSG) layer.

6. The bonding pad structure as claimed in claim 1, wherein said conducting pad is a metal layer.

7. The bonding pad structure as claimed in claim 1, wherein said passivation layer is a silicon-oxynitride layer.

8. A bonding pad structure formed on a semiconductor substrate for bonding with a conducting line drawn in a direction, comprising:

a buffer layer formed over said substrate;

a planarization layer formed on said buffer layer and patterned to shape a plurality of contact holes;

a conducting pad formed on said planarization layer and filled in said contact holes so as to mechanically interlock with said planarization layer; and a passivation layer overlying peripherals of said conducting pad to have an overhang region therebetween, wherein a portion of said overhang region close to said drawing direction has a width greater than the other portion of said overhang region.

9. The bonding pad structure as claimed in claim 8, wherein said contact holes are positioned within the range of said overhang region.

10. The bonding pad structure as claimed in claim 8, wherein said contact holes are positioned underneath said conducting pad.

11. The bonding pad structure as claimed in claim 8, wherein said contact holes are positioned underneath said wider portion of said overhang region.

12. The bonding pad structure as claimed in claim 8, wherein said contact holes are positioned underneath a portion of said conducting pad close to said drawing direction.

13. The bonding pad structure as claimed in claim 8, wherein said buffer layer is a polysilicon layer.

14. The bonding pad structure as claimed in claim 8, wherein said planarization layer is a borophosphosilicate glass (BPSG) layer.

15. The bonding pad structure as claimed in claim 8, wherein said conducting pad is a metal layer.

16. The bonding pad structure as claimed in claim 8, wherein said passivation layer is a silicon-oxynitride layer.

* * * * *